(12) United States Patent
Erie et al.

(10) Patent No.: US 6,212,217 B1
(45) Date of Patent: Apr. 3, 2001

(54) SMART LASER WITH AUTOMATED BEAM QUALITY CONTROL

(75) Inventors: Frederic G. Erie, Oceanside; Jesse D. Buck, San Marcos; Palash P. Das, Vista, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/390,579

(22) Filed: Sep. 3, 1999

Related U.S. Application Data (63) Continuation-in-part of application No. 09/248,466, filed on Feb. 11, 1999, now Pat. No. 6,094,448, which is a continuation-in-part of application No. 08/886,715, filed on Jul. 1, 1997, now Pat. No. 5,970,082.

(51) Int. Cl.[7] .................................. H01S 3/08; H01S 3/10
(52) U.S. Cl. ............................. 372/102; 372/20; 372/57; 372/99
(58) Field of Search ............................ 372/20, 32, 99, 372/100, 102, 107, 108, 57, 58, 98; 385/37

(56) References Cited

U.S. PATENT DOCUMENTS

| | | | |
|---|---|---|---|
| 5,025,445 | * 6/1991 | Anderson et al. | 372/20 |
| 5,095,492 | 3/1992 | Sandstrom | 372/102 |
| 5,230,005 | * 7/1993 | Rubino et al. | 372/20 |
| 5,297,155 | * 3/1994 | Pan et al. | 372/20 |
| 5,856,991 | * 1/1999 | Ershov | 372/20 |
| 6,055,348 | * 4/2000 | Jin et al. | 385/37 |

OTHER PUBLICATIONS

Press, William, H., Flannery, Brian, P., Teukolsky,Saul A., Vettering, William T., "Numerical Recipes, The Art of Scientific Computing", Cambridge, University Press, 1990, pp. 274–277, 289–293 and 312–321.

* cited by examiner

Primary Examiner—Hemang Sanghavi
(74) Attorney, Agent, or Firm—John R. Ross, Esq.

(57) ABSTRACT

A smart laser having automatic computer control of pulse energy, wavelength and bandwidth using feedback signals from a wavemeter. Pulse energy is controlled by controlling discharge voltage, wavelength by controlling the position of an $R_{MAX}$ mirror in a line narrowing module and bandwidth is controller by adjusting the curvature of a grating in the line narrowing module. Preferred embodiments include automatic feedback control of horizontal and vertical beam profile by automatic adjustment of a prism plate on which beam expander prisms are located and automatic adjustment of the $R_{MAX}$ tilt.

13 Claims, 8 Drawing Sheets

SMART LASER WITH AUTOMATED BEAM QUALITY CONTROL

This is a continuation-in-part application of Ser. No. 09/248,466, filed Feb. 11, 1999, now U.S. Pat. No. 6,094,448, which is a CIP of 08/886,715 filed Jul. 1, 1997 now U.S. Pat. No. 5,970,082. This invention relates to lasers and in particular to lasers with feedback control of beam quality.

BACKGROUND OF THE INVENTION

In many laser applications precise control of beam output is desired. One such application for such lasers is the light source for integrated circuit lithography. Currently the KrF excimer laser is the choice light source for state of the art integrated circuit lithography devices. Specifications for the light source are becoming tighter as efforts are made to increase production and produce finer integrated circuit patterns.

Typical specifications for a 248 nm KrF laser call for bandwidths of about 0.6 pm full width half maximum, wavelength stability within 0.1 pm of the specified wavelength and energy dose stability of about ±0.5 percent. In addition, control of beam cross section intensity values are important.

Figure 1:
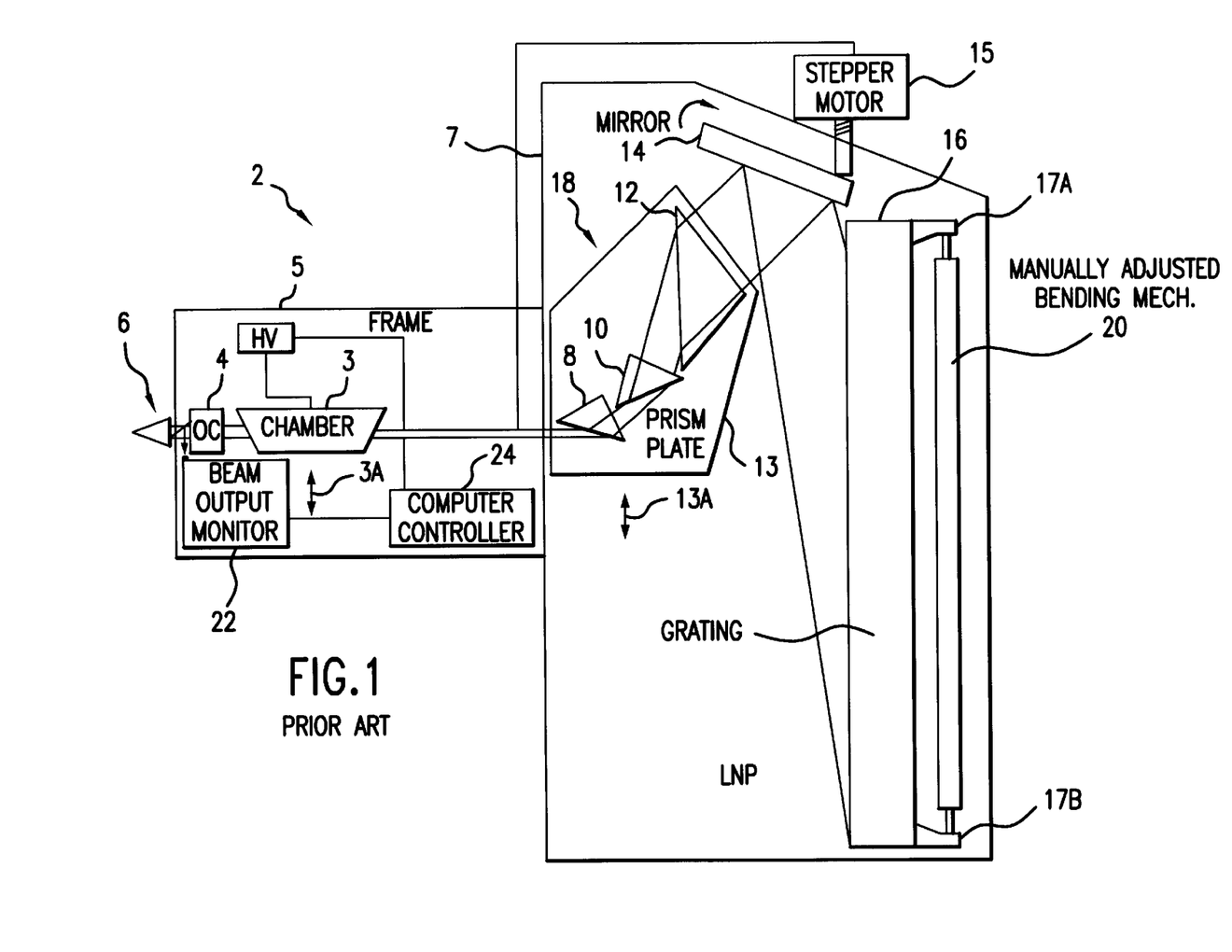
FIG. 1 shows a prior narrow band art laser configuration.

FIG. 1 shows some of the features of a prior art KrF excimer laser system used for IC lithography. The system includes a laser frame structure 5 within which is mounted a laser chamber 3 containing two elongated electrodes (not shown) between which is a gain medium, a line narrowing module (referred to as a "line narrowing package" or LNP) 7 shown disproportionately large and an output coupler 4. The LNP portion of FIG. 1 represents a top view of the LNP. The beam cross section is generally rectangular, typically about 3.5 mm wide and about 15 mm high. In prior art devices each of the line narrowing module 7 and the output coupler module 4 comprise frames which are fixedly mounted to laser frame structure 5. Optical components within the frames of the output coupler module and the line narrowing module are adjusted manually to define the laser resonance cavity. The chamber is adjustably mounted within the laser frame so that it can be finely positioned manually within the defined resonance cavity from time to time in the direction of the beam width as shown by arrows 3A on FIG. 1. These adjustments permit a laser technician to align the resonance cavity with the gain medium in order to achieve optimum beam output parameters. In this prior art for example, a three prism beam expander 18 is comprised of prisms 8, 10 and 12 mounted on prism plate 13. In the prior art device, prism plate 13 can be manually adjusted in the direction of arrows 13A as an alignment technique. The prior art device also includes a manual adjustment of the curvature of the surface of grating 16 into an increasingly or decreasingly concave shape by expanding or contracting bending mechanism 20 to place larger or smaller compressive forces on legs 17A and 17B. The adjustment is done primarily to control bandwidth of the output beam. Another prior art technique for forcing a concave shape on the grating surface is described in U.S. Pat. No. 5,095,492.

Typical prior art lithography excimer lasers now in use incorporate two automatic feedback controls to regulate pulse energy and nominal wavelength. Pulse energy is controlled in a feedback system by measuring the output pulse energy with a beam output monitor 22 as shown in FIG. 1 and then using these measurements with a computer controller 24 to control the high voltage applied between the electrodes in order to regulate pulse energy within desired limits. The beam output monitor 22 (also called a wavemeter) also measures the nominal wavelength and bandwidth of the pulsed output beam. Computer controller 24 adjusts the pivot position of tuning mirror 14 using stepper motor 15 in order to control the nominal wavelength of the beam to within desired limits.

What is needed are improvements which will provide easier, faster and more precise control of laser beam output parameters.

SUMMARY OF THE INVENTION

The present invention provides a smart laser having automatic computer control of pulse energy, wavelength and bandwidth using feedback signals from a wavemeter. Pulse energy is controlled by controlling discharge voltage, wavelength by controlling the position of an $R_{MAX}$ mirror in a line narrowing module and bandwidth is controller by adjusting the curvature of a grating in the line narrowing module. Preferred embodiments include automatic feedback control of horizontal and vertical beam profile by automatic adjustment of a prism plate on which beam expander prisms are located and automatic adjustment of the $R_{MAX}$ tilt. Other preferred embodiments include automatic adjustment of the horizontal position of the laser chamber within the resonance cavity.

DETAILED DESCRIPTION OF THE PREFERRED EMBODIMENTS

Preferred embodiments of the present invention can be described by reference to the drawings.

First Preferred Embodiment

Figure 2:
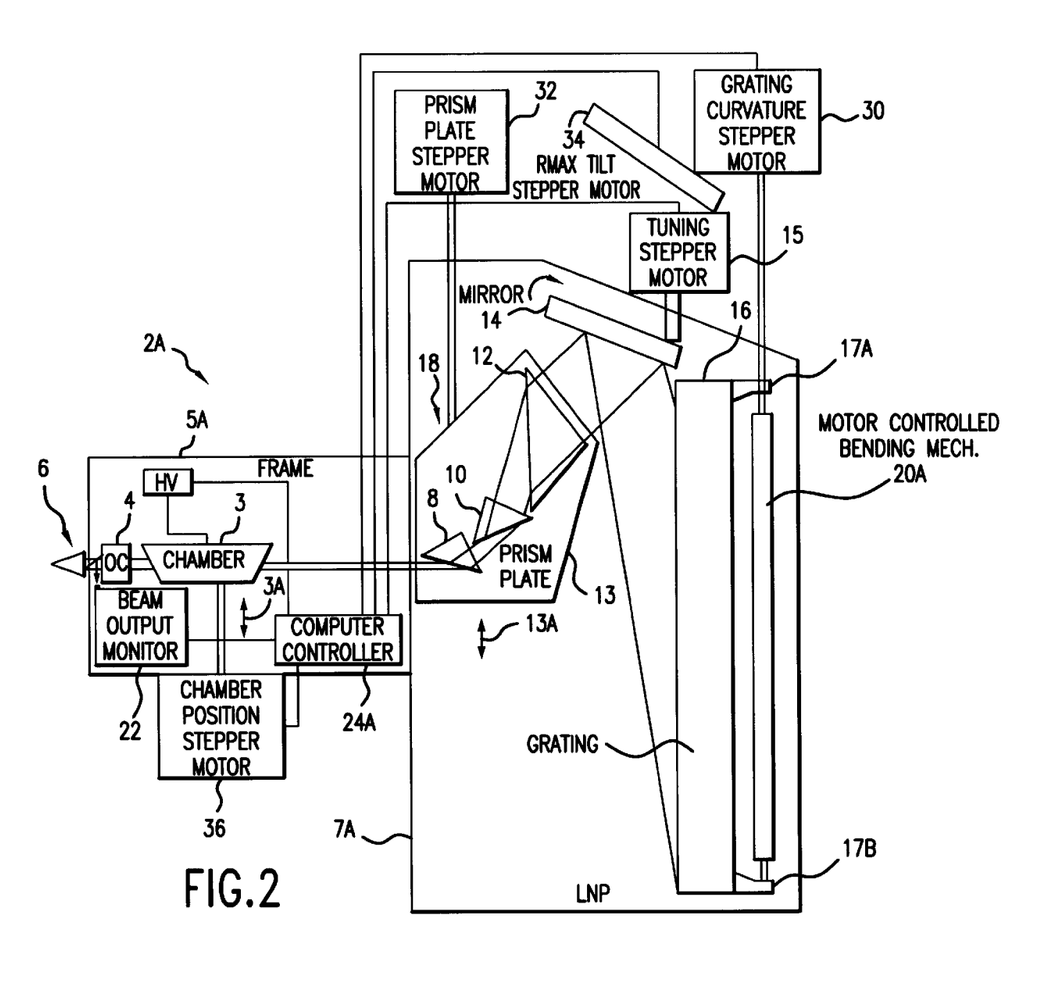
FIG. 2 shows a preferred embodiment of the present invention.

A combination block diagram schematic drawing of a first preferred embodiment of the present invention is shown in FIG. 2. This drawing shows important improvements over the prior art which automate the alignment of the laser chamber and components in order to provide greatly improved instant control of the important laser beam parameters. The new laser frame 5A has added on to it a chamber position stepper motor to automatically adjust the horizontal position of the chamber in the direction 3A. The new LNP 7A includes a prism plate stepper motor 32, an R-max tilt stepper motor 34 and a grating curvature motor 30. All of these stepper motors are controlled by computer controller 24A.

Two-Way Automatic Control of Grating Surface Curvature

A grating curvature stepper motor 30 has been added to control the curvature of grating 16. The system includes a new bending mechanism design 20A which has the capacity to apply either a compressive force to spread apart legs 17A and 17B to create a concave curvature in the lined surface of grating 16 or a tension force to pull together legs 17A and 17B to create a convex curvature in the lined surface of grating 16. Control of motor 30 is provided by computer controller 24.

Figure 3A:
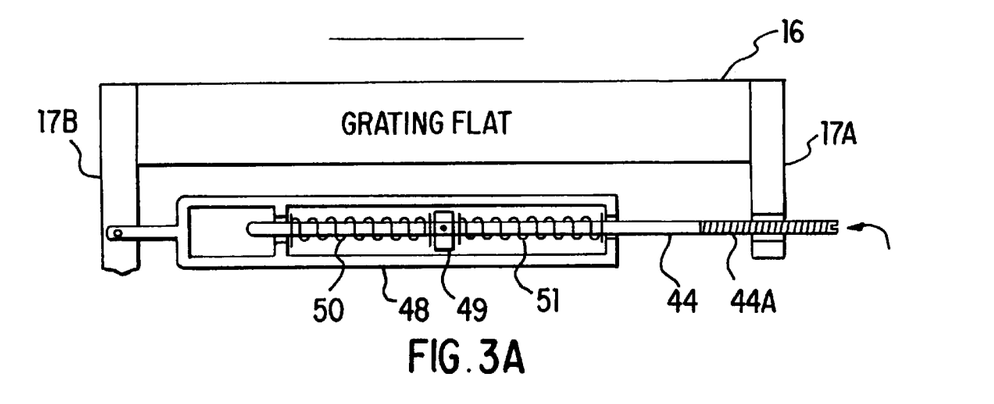
FIGS. 3A, B, and C show the operational principals of a grating bending mechanism.
Figure 3B:
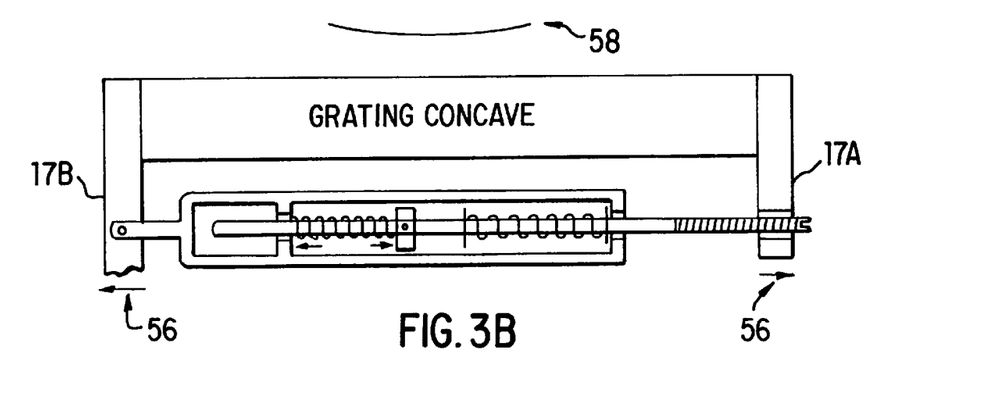
Figure 3C:
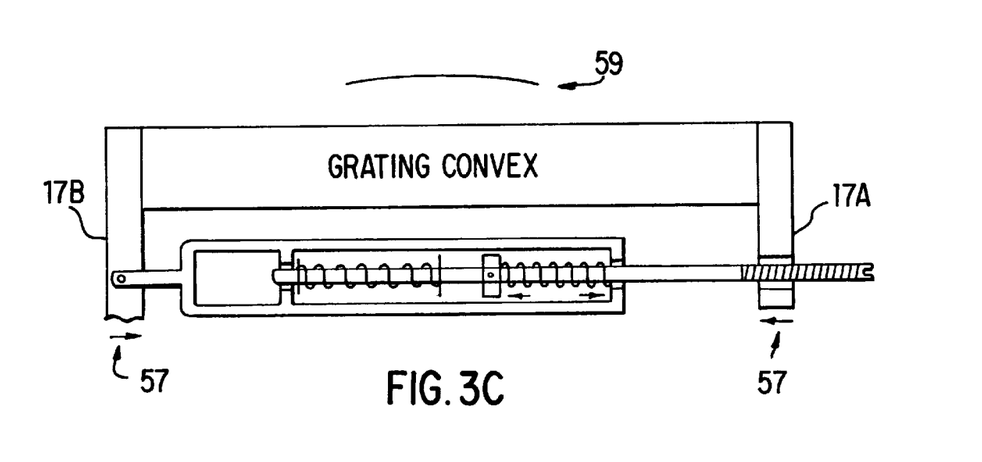

The basic elements and a functional description of the operation of the grating bending mechanism is shown in FIGS. 3A, 3B and 3C. FIG. 3A shows a grating assembly having a bidirectional control unit attached to it but with no bending force applied to the grating. Shown are grating 16, left end plate 17B, right end plate 17A, compression spring housing 48, left compression spring 50, right compression spring 51, adjustment shaft 44 and piston 49 which is fixedly pinned to adjustment shaft 44. Adjustment shaft 44 comprises threaded length 44A (¼–28 UNF- 2B×1.38 long) which mates with threaded channel in right end plate 17A. In the FIG. 3A condition, both springs are applying equal compressive force which offset each other or both springs may be unloaded. The curvature of the grating surface is adjusted by turning shaft 44. By screwing shaft 44 into housing 48, left compression spring 50 is compressed against the left side of housing 48 and piston 49 as shown by the two arrows inside housing 48 in FIG. 3B. The compression force pushes rod 44 to the right and housing 48 to the left which has the effect of pushing apart the two end plates 17A and 17B as shown by arrows 56. This has the effect of bending the surface of grating 1 into a concave shape as shown by line 58.

Conversely, by screwing shaft 44 in a direction to drive rod 44 out of housing 48, right compression spring 51 is compressed against the right side of housing 48 and piston 49 as shown by the two arrows inside housing 48 in FIG. 3C. The compressive force pulls rod 44 to the left and pulls housing 48 to the right which has the effect of pulling end plates 17A and 17B together as shown by arrows 57. This has the effect of bending the surface of grating 1 into a convex shape as shown by line 59.

In this preferred embodiment rod 44 has 28 threads per inch and the springs are rated at 52 pounds per inch. Operators are able with this design to make extremely fine adjustments to the curvature of the grating surface.

Figure 4:
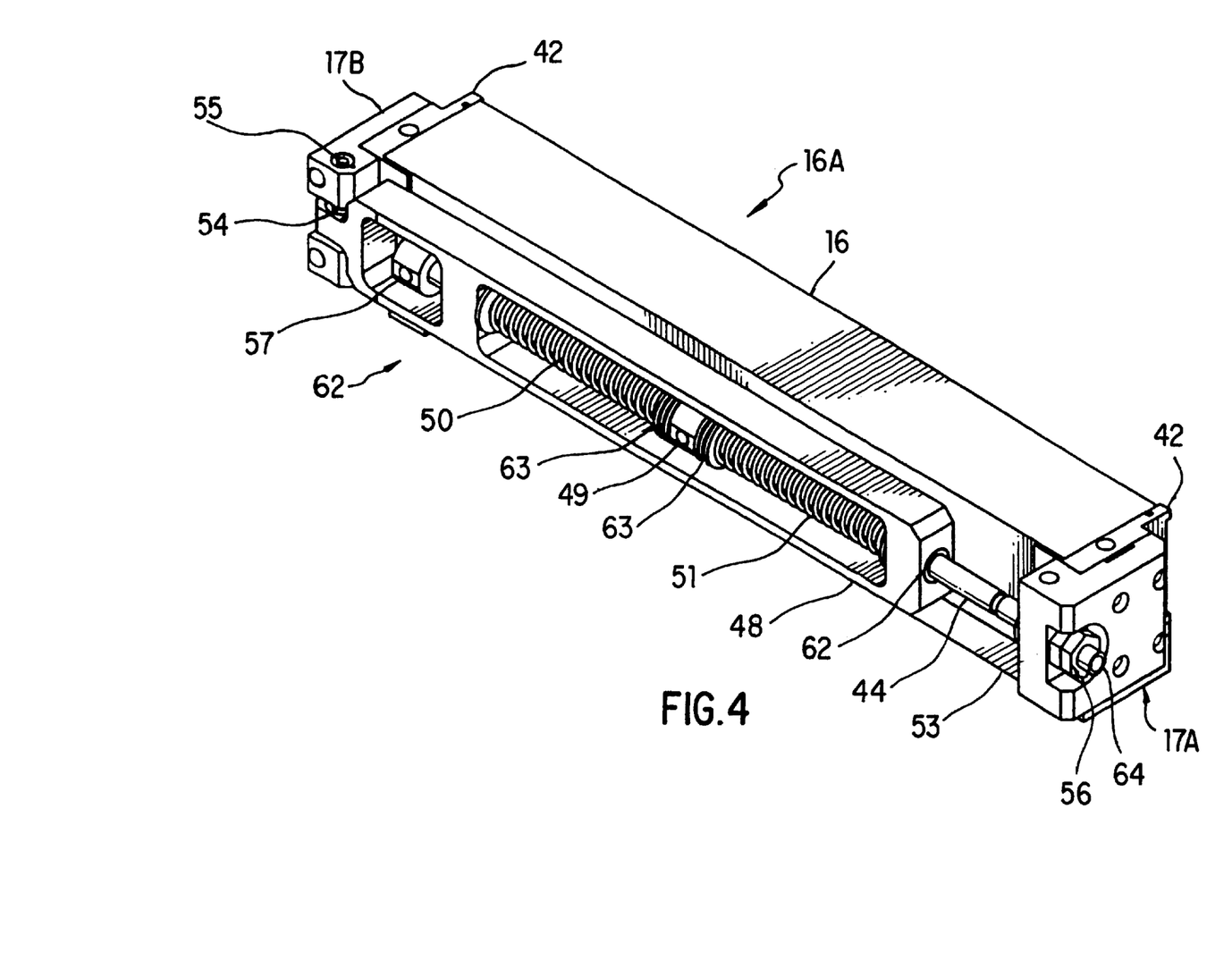
FIG. 4 shows a prospective view of the bending mechanism.

FIG. 4 is a perspective view of a grating assembly 16A fabricated by Applicants and their co-workers. The assembly is comprised of grating 16, two grating end plates 42 (bonded to grating 16) right bi-directional bandwidth control end plate 17A, lock nut 56, invar base plate 53 bonded to grating 16, alignment rod 44, socket 64, two linear bearings 62, compression spring housing 48, right compression spring 51, two thrust bearings 63, piston 49 pinned to rod 44, left compression spring 50, travel limiting piston 57 pinned to rod 44, radial ball bearing 54, pivot shaft 55 and left bandwidth control end plate 17B.

Figure 5:
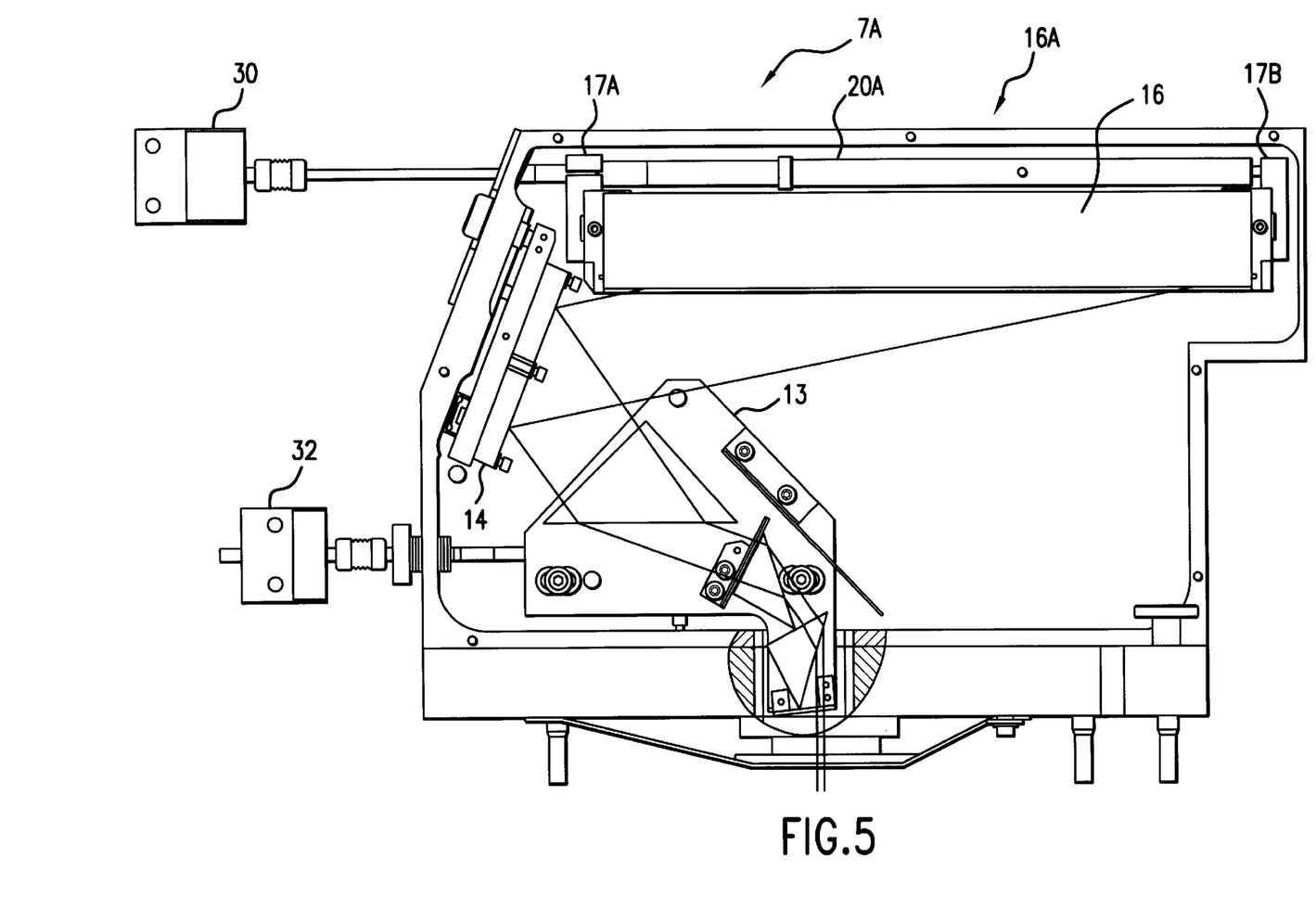
FIG. 5 shows some of the features of the FIG. 2 preferred embodiment.

FIG. 5 is a cutaway drawing of LNP 7A. It shows the two-way curvature-controlled grating assembly 16A. Also shown is grating curvature control stepper motor 30 for controlling the curvature of the lined surface of grating 16 from concave to convex as explained above with reference to FIGS. 3A, 3B and 3C. FIG. 5 also shows prism plate adjustment motor 32. Motor controls for $R_{MAX}$ mirror 14 are not shown in FIG. 5.

Figure 7A:
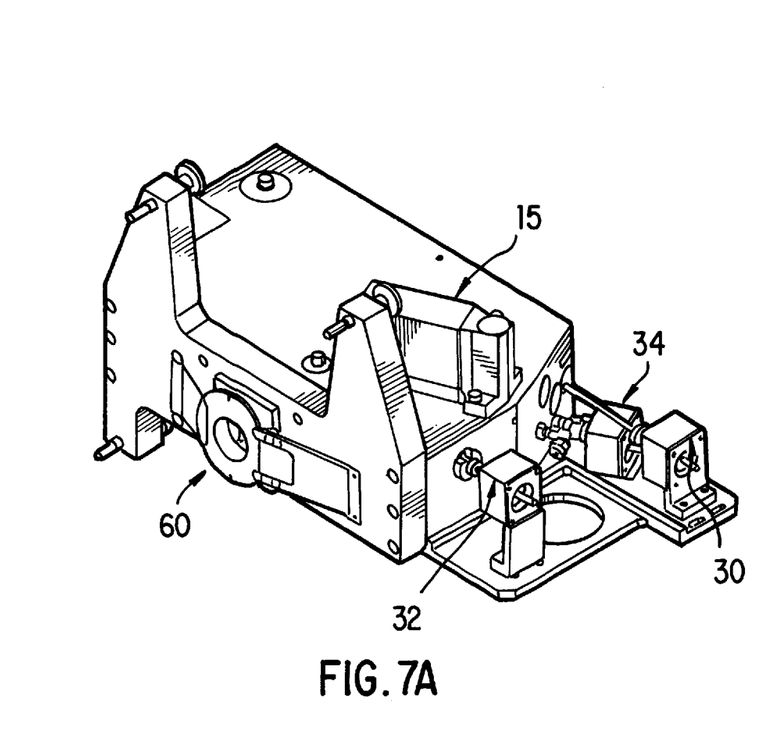
FIGS. 7A and B show bottom prospective views of the line narrowing module of the FIG. 2 embodiment.
Figure 7B:
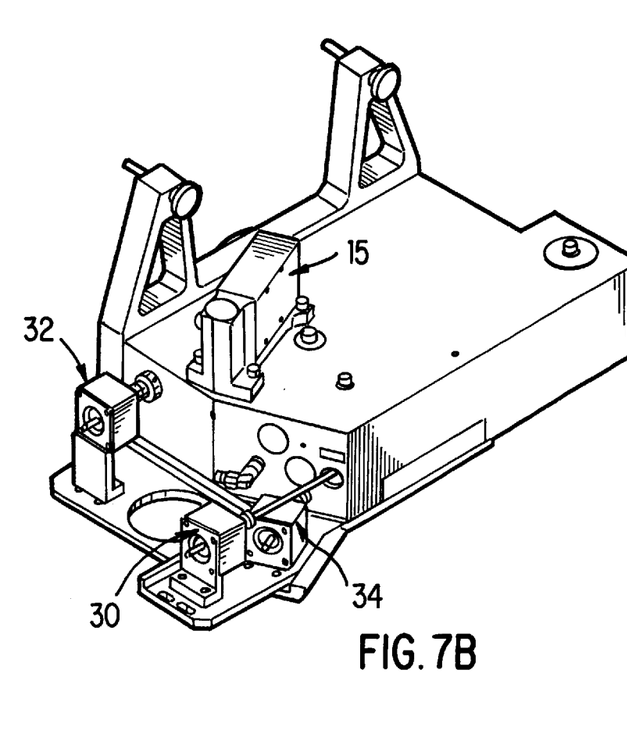

Bottom views of line narrowing package 7A are shown in FIG. 7A (from the front, i.e., looking from the laser toward the LNP) and in FIG. 7B (from the rear). Grating curvature stepper motor 30 is shown mounted on its mounting plate. Prism plate motor is shown at 32 and $R_{MAX}$ tilt motor is shown at 34 and $R_{MAX}$ stepper motor is shown at 15. The beam entrance-exit port for the LNP is shown at 60.

Prism Plate Position Control

Position control of prism plate 13 is depicted in cutaway drawing 5A which also shows prism plate stepper motor 32. Stepper motor 32 is also shown in FIGS. 7A and 7B mounted on its mounting plate. Control of motor 32 is provided by computer controller 24.

Figure 6A:
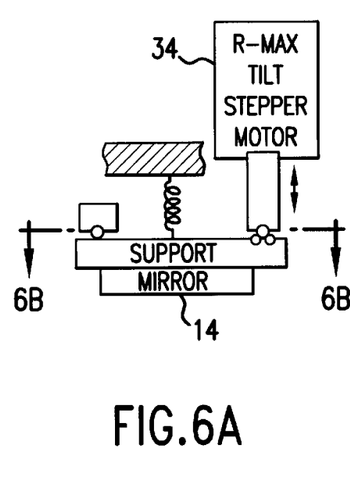
FIGS. 6A, B, C and D show other features of the FIG. 2 embodiment.
Figure 6B:
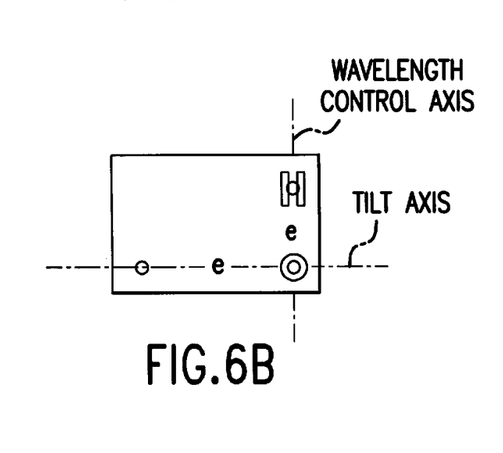
Figure 6C:
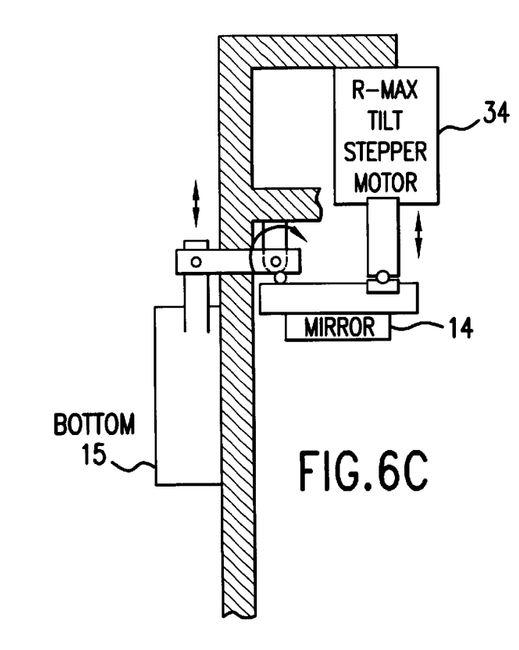
Figure 6D:
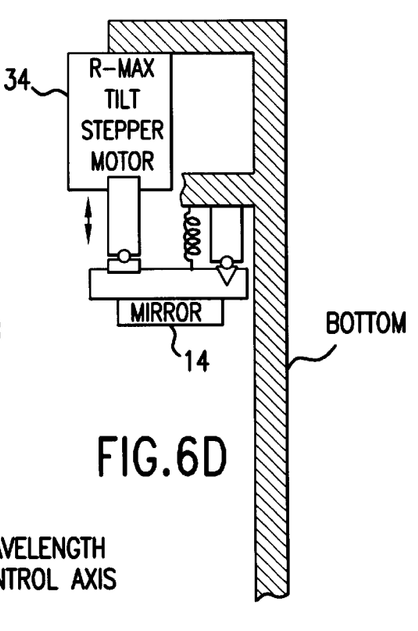

Automatic $R_{MAX}$ Tilt Control $R_{MAX}$ tilt control stepper motor is shown at 34 in FIGS. 7A and 7B and 6A, C and D. The tilt of $R_{MAX}$ mirror 14 is provided by $R_{MAX}$ stepper motor 34 which is also controlled by computer controller 24. The tilt of mirror 14 determines the vertical angle of light reflecting in the resonance cavity.

Wavelength Selection with Tuning Mirror

In this preferred embodiment, wavelength selection is provided with stepper motor 15 setting the pivotal horizontal position of tuning mirror 14 based on direction from computer controller 24 which utilizes feedback wavelength information from wavemeter 22 in accordance with prior art techniques as discussed in the background section of this specification.

Automatic Chamber Position Control

This first preferred embodiment include chamber position stepper motor 36 shown in FIG. 2 which automatically adjusts relative to frame 5 (on which is mounted output coupler 4 and line narrowing package 7) the horizontal position of laser chamber 3 (and thus the horizontal position of the gain medium contained therein) in the direction perpendicular to the direction of beam 6.

Controls

Computer controller is preferably programmed with control algorithms which control motors 36, 32, 34, 30 in addition to 15 in order to maintain beam parameters within desired ranges based on feedback signals from wavemeter 22. A simple approach is to hold all positions constant except one (for example chamber position stepper motor) and scan that item over a predetermined range to seek the position producing the optimum beam performance looking at parameters such as pulse energy output, pulse energy stability and bandwidth. The computer can be programmed to make these scans on operator instruction or to do the scans on a predetermined periodic basis. The computer could also be programmed to make one or more of these types of scans, seeking optimum position, if wavemeter detects a deterioration of any beam quality.

Also during burst mode operation of the laser (where, for example, the laser is operated to produce bursts of pulses such as 300 pulses at a rate of 1000 pulses per second followed by a downtime of 0.3 seconds) beam parameters are known to vary as a function of pulse number (i.e., time after the start of the bursts). In order to moderate or compensate for these variations, the computer controller could be programmed to adjust one or more of the stepper motors as a function of time after the start of the bursts.

Specific Optimization Techniques

In one preferred performance optimization technique a figure of merit M is defined in order to judge optimum laser performance. Adjustments are then made to maximize the value of the figure of merit. This value is computed using input from sensors which measure the beam in real time. These sensors typically provide values such as energy stability, laser efficiency (energy out for voltage in), bandwidth, beam width, beam symmetry, pointing stability, etc. In general the best figure of merit will combine the several parameters which are most important for determining success in the application, such as lithography exposure. For example if only laser efficiency as measured by pulse energy/charging voltage (E) was considered important to the figure of merit would be M=pulse energy/charging voltage, or

M=E

If spacial symmetry (in the horizontal direction), SH, is to be judged in addition E, then S should be measured and given a weighting factor, $W_{SH}$. Perfect symmetry would be zero. The new formula for figure of merit would then be:

$$M=E-(W_{SH})(SH)$$

Adjustments would then be made to minimize M. Similarly the figure of merit M could be made a function of other parameters such as vertical symmetry (VS), bandwidth (B), wavelength stability (WS) and dose stability (DS). In this case the formula for M would be:

$$M=E-(W_{SH})(SH)-(W_{SV})(SV)-(W_B)(B)-(W_{WS})(WS)-(W_{DS})(DS)$$

Again, the computer is programmed to make adjustments to the stepper positions, measure E, SH, SV, B, WS and DS, apply weighting factors to achieve minimum figures of merit M.

Many techniques are well known for optimizing laser performance where several parameters of the type discussed above are considered. One preferred embodiment is the downhill simplex method which is documented in the book *Numerical Recipes, The Art of Scientific Computing* by W. H. Press, et al., Cambridge University Press 1990 and referenced therein. In brief, a group of initial settings is chosen for the adjustments. There will be a number of configurations (a configuraiton is a set of values for the adjustments) which is one greater than the number of parameters being adjusted. For one iteration, the adjustments are set to each configuration and the figure of merit is measured. The configuration with the worst merit is then rejected and replaced with a new configuration which is closer to the best configuration. As the iterations proceed, the configurations become closer to one another until any one of them may be chosen as the optimum. In early work, Applicants have found that about 10 iterations suffice to locate the optimum. The downhill simplex method is a reliable technique, however, if very rapid convergence is needed other well known techniques could be utilized.

Measurement of Additional Beam Parameters

Figure 8:
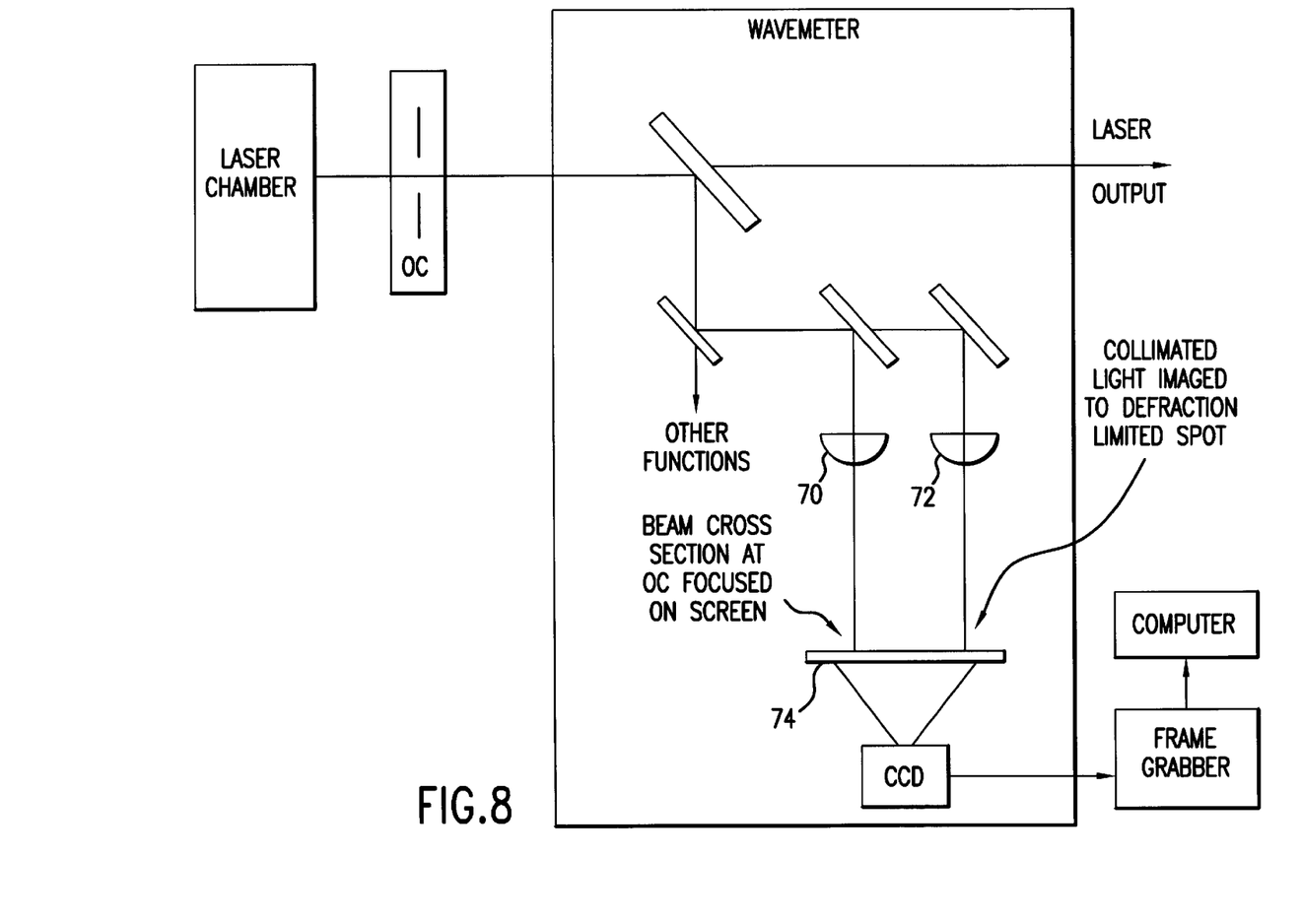
FIG. 8 shows an optical setup for measuring selected beam parameters.

In order to measure various beam parameters, Applicants provided the optical setup described in FIG. 8. An image of the laser beam at the output coupler aperture was relayed optically through lens 70 to a fluorescent screen and beam parameters including vertical and horizontal symmetry were determined utilizing a CCD camera focused on fluorescent screen 74 as shown in FIG. 8. The fluorescent screen converts the UV light from the laser to visible light which is monitored by the CCD camera. The analog output from the camera is converted to digital with a video frame grabber and the output of the frame grabber is analyzed by a computer processor.

Applicants in conjunction with this work were also able to monitor beam divergence, beam pointing and beam pointing stability with a second beam path through lens 72 as shown in FIG. 8. In this case, lens 72 focuses the laser beam onto the fluorescent screen 74 and is located so that perfectly colluminated light entering the lens would appear as a diffraction limited spot at the fluorescent screen. Therefore, the size of the spot is a measure of the divergence of the beam and movement of the spot is a measure of changes in beam pointing. These additional parameters could be used with the present invention to optimize laser performance taking into consideration these parameters.

Although this invention has been disclosed and illustrated with reference to particular embodiments, the principals involved are susceptible for use in numerous other embodiments which will be apparent to persons skilled in the art. For example, each of the stepper motors could be replaced with alternative positioner units such as, ac or dc motors or hydraulic or pneumatic positioners. Many methods of controlling the positioners other than the suggested computer programs could be utilized. One or more stepper motors could be applied to the output coupler to automatically position it using similar techniques as described above for the $R_{MAX}$ mirror. Three strong permanent magnets could be used in the place of the two compression springs with one of the magnets replacing the piston as shown in FIG. 6. Magnet 60 is fixed to rod 4 and magnets 62 and 64 are fixed to housing 8. Rod 4 passes through holes in magnets 62 and 64. The effect of screwing rod 4 into and out of housing 8 is substantially the same as described above. The curvature of the grating could be accomplished using any of a large number of techniques. For example, compression or tension could be applied at a number of points to create virtually any shape desired and these shapes could be subject to feedback computer control. Also, the tuning mirror 14 could be a deformable mirror subject to deformation to any desired shape in order to correct wave front distortions. The deformation could be manual or it could be piezoelectric or motor controlled and as with the grating it could be controlled in a feedback circuit. The invention is therefore to be limited only as indicated by the scope of the appended claims and their legal equivalents.

We claim:

1. A smart narrow band electric discharge laser for producing an output laser beam said laser comprising:

A) a laser from;

B) a laser chamber adjustably mounted in said frame;

C) a laser gas contained within said chamber;

D) two elongated spaced apart electrodes contained within said chamber, said electrodes and laser gas between them defining a gain medium;

E) an output coupler;

F) a line narrowing module comprising a prism beam expander, an $R_{MAX}$ mirror and a bendable grating defining a grating curvature, said line narrowing module and its optical components and the output coupler defining a resonance cavity;

G) a wavemeter for detecting laser beam parameters including at least pulse energy, wavelength and bandwidth;

H) a computer controller; and

I) a grating curvature positioner controlled by said computer controller to adjust the grating curvature based on bandwidth information provided to said computer controller by said wavemeter.

2. The smart laser as in claim 1 and further comprising a chamber positioner unit for positioning said chamber in a horizontal direction so that said gain medium is in a desired position with respect to the resonance cavity.

3. The smart laser as in claim 2 wherein the computer controller is programmed to control said chamber positioner unit to position said chamber based on feedback information from said wavemeter.

4. The smart laser as in claim 1 wherein said prism beam expander comprises a plurality of prisms disposed on a prism plate, and further comprising a prism plate positioner unit for positioning said prism plate.

5. The smart laser as in claim 4 wherein said computer controller is programmed to control said prism plate positioner unit to position said prism plate based on feedback information from said wavemeter.

6. The smart laser as in claim 1 and further comprising an $R_{MAX}$ tilt positioner to tilt said $R_{MAX}$ mirror to control vertical spatial parameters of said output laser beam.

7. The smart laser as in claim 6 wherein said computer controller is programmed to control said tilt positioner to tilt said $R_{MAX}$ mirror based on beam information from said wavemeter.

8. The smart laser as in claim 1 wherein said beam expander comprises a plurality of prisms disposed on a movable prism plate and further comprising:

A) a chamber positioner unit for positioning said chamber in a horizontal direction upon control signals from said computer controller;
B) a prism plate positioning unit for positioning said prism plate upon control signals from said computer controller;
C) an $R_{MAX}$ tilt positioner to tilt said $R_{MAX}$ mirror based upon control signals from said computer controller; and
D) an $R_{MAX}$ pivot positioner to pivot said $R_{MAX}$ mirror to adjust nominal wavelength of said output beam based on control signals from said computer controller.

9. The smart laser as in claim 1 wherein said grating curvature positioner comprises a stepper motor.

10. The smart laser as in claim 2 wherein said chamber positioner is a stepper motor.

11. The smart laser as in claim 4 wherein said prism plate positioner is a stepper motor.

12. The smart laser as in claim 6 wherein said $R_{MAX}$ tilt positioner is a stepper motor.

13. The smart laser as in claim 8 wherein all of said positioners are stepper motors.

* * * * *

UNITED STATES PATENT AND TRADEMARK OFFICE
CERTIFICATE OF CORRECTION

PATENT NO. : 6,212,217 B1 Page 1 of 1
APPLICATION NO. : 09/390579
DATED : April 3, 2001
INVENTOR(S) : Eric et al.

It is certified that error appears in the above-identified patent and that said Letters Patent is hereby corrected as shown below:

<u>Column 6:</u>
Line 43, change "from" to --frame--.

Signed and Sealed this

Eighteenth Day of July, 2006

JON W. DUDAS
*Director of the United States Patent and Trademark Office*